(12) United States Patent
Nguyen et al.

(10) Patent No.: US 8,187,932 B2
(45) Date of Patent: May 29, 2012

(54) THREE DIMENSIONAL HORIZONTAL DIODE NON-VOLATILE MEMORY ARRAY AND METHOD OF MAKING THEREOF

(75) Inventors: Natalie Nguyen, San Jose, CA (US); Paul Wai Kie Poon, Fremont, CA (US); Steven J. Radigan, Fremont, CA (US); Michael Konevecki, San Jose, CA (US); Raghuveer S. Makala, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 120 days.

(21) Appl. No.: 12/905,445

(22) Filed: Oct. 15, 2010

(65) Prior Publication Data

US 2012/0091413 A1    Apr. 19, 2012

(51) Int. Cl.
*H01L 21/8234* (2006.01)
(52) U.S. Cl. ............... 438/237; 438/257; 257/E21.645; 257/E21.662
(58) Field of Classification Search .................... 438/237
See application file for complete search history.

(56) References Cited

U.S. PATENT DOCUMENTS

| 5,160,987 A | 11/1992 | Pricer et al. |
| 2004/0256610 A1 | 12/2004 | Lung |
| 2008/0175032 A1 | 7/2008 | Tanaka et al. |
| 2008/0217600 A1 | 9/2008 | Gidon |
| 2008/0265235 A1 | 10/2008 | Kamigaichi et al. |
| 2009/0230458 A1 | 9/2009 | Ishiduki et al. |
| 2009/0321878 A1 | 12/2009 | Koo et al. |
| 2010/0219392 A1 | 9/2010 | Awaya et al. |
| 2010/0240205 A1 * | 9/2010 | Son et al. .................... 438/588 |
| 2010/0252909 A1 | 10/2010 | Nakanishi et al. |
| 2010/0254191 A1 | 10/2010 | Son et al. |

OTHER PUBLICATIONS

International Search Report & Written Opinion issued in PCT Application PCT/US2011/055721, mailed on Dec. 5, 2011.

* cited by examiner

*Primary Examiner* — Long Tran
*Assistant Examiner* — Shaka Scarlett
(74) *Attorney, Agent, or Firm* — The Marbury Law Group PLLC

(57) ABSTRACT

A non-volatile memory device contains a three dimensional stack of horizontal diodes located in a trench in an insulating material, a plurality of storage elements, a plurality of word lines extending substantially vertically, and a plurality of bit lines. Each of the plurality of bit lines has a first portion that extends up along at least one side of the trench and a second portion that extends substantially horizontally through the three dimensional stack of the horizontal diodes. Each of the horizontal diodes is a steering element of a respective non-volatile memory cell of the non-volatile memory device, and each of the plurality of storage elements is located adjacent to a respective steering element.

12 Claims, 15 Drawing Sheets

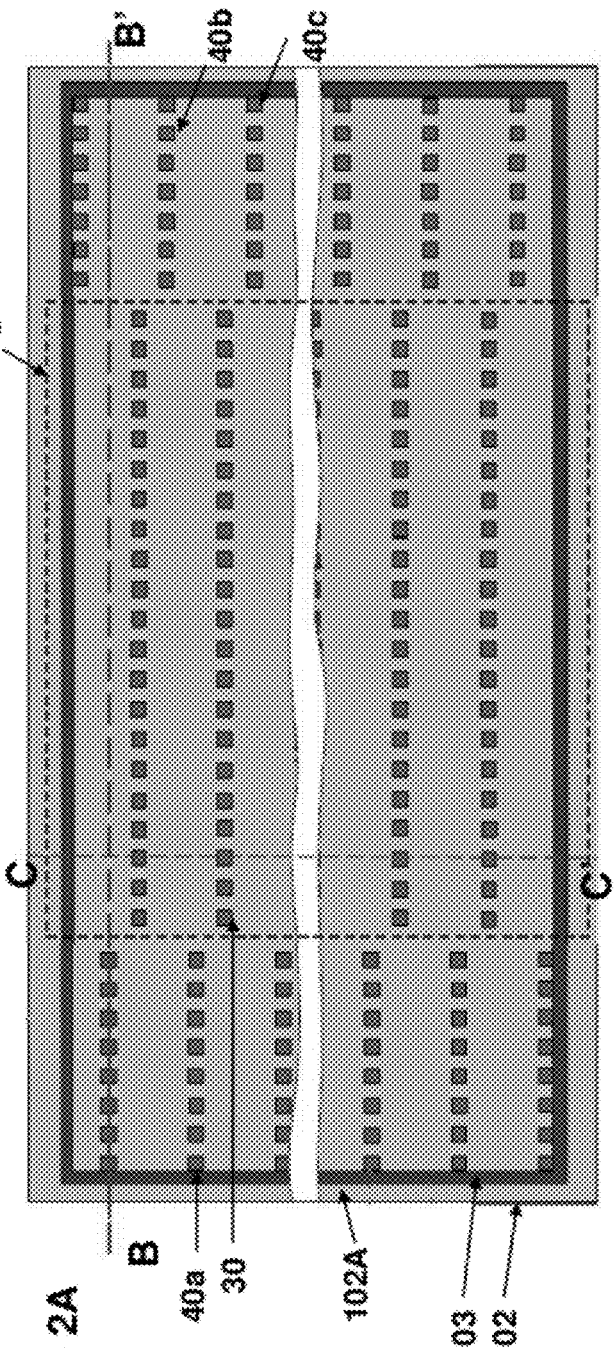
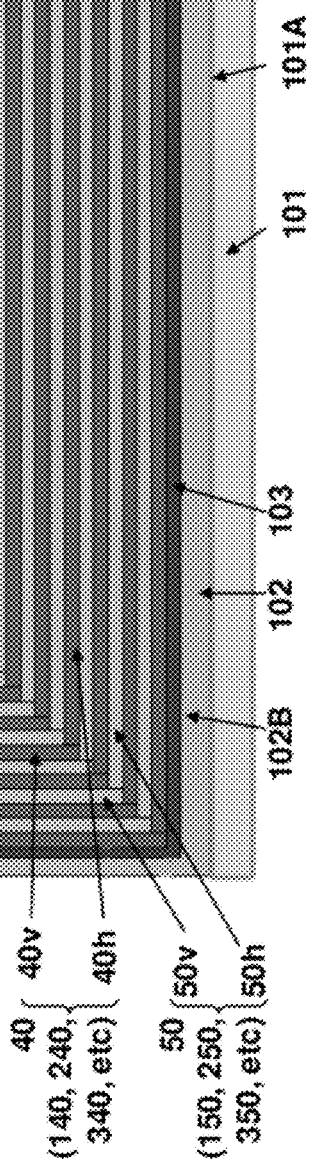
Figure 2A
Figure 2B

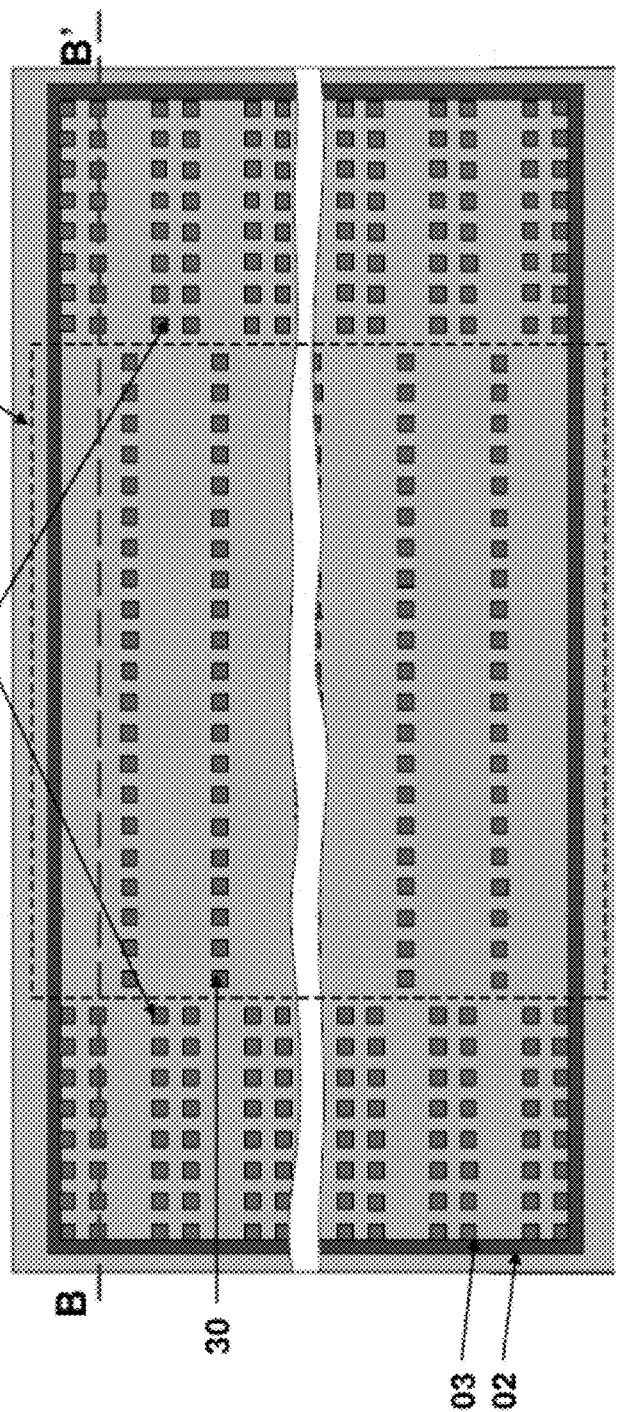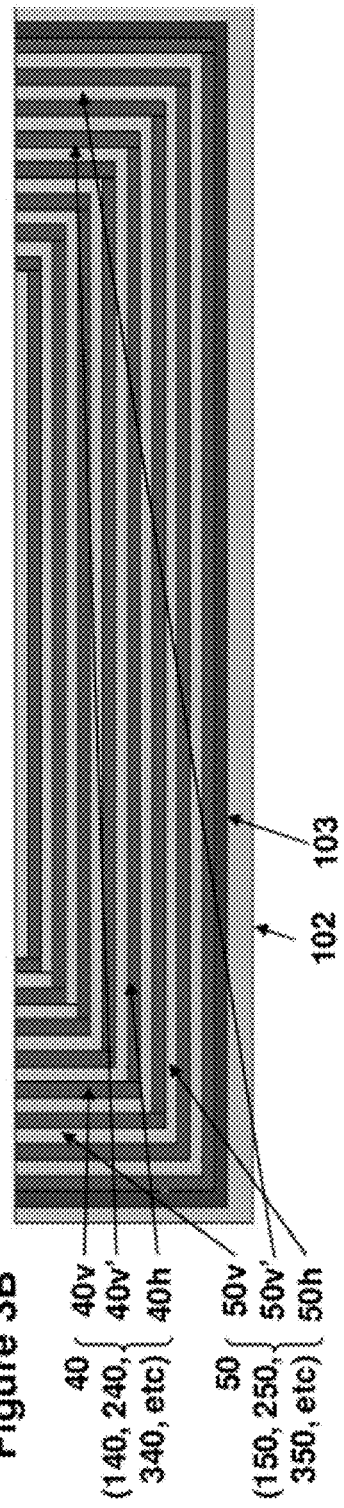
Figure 3A
Figure 3B

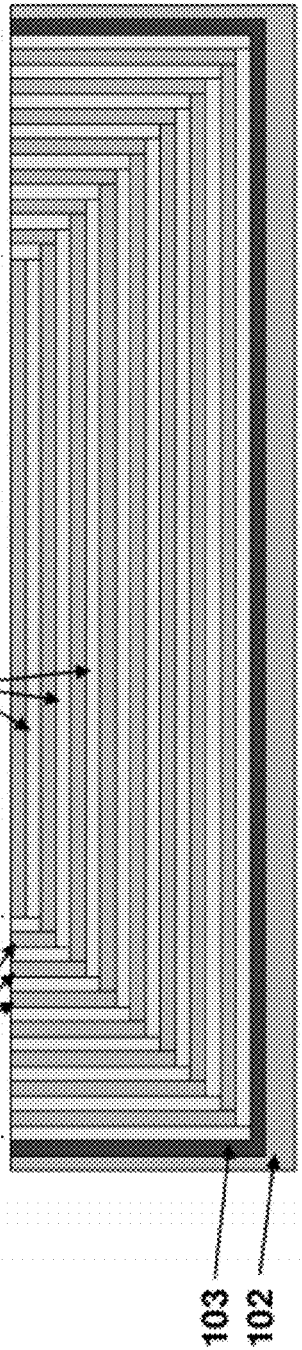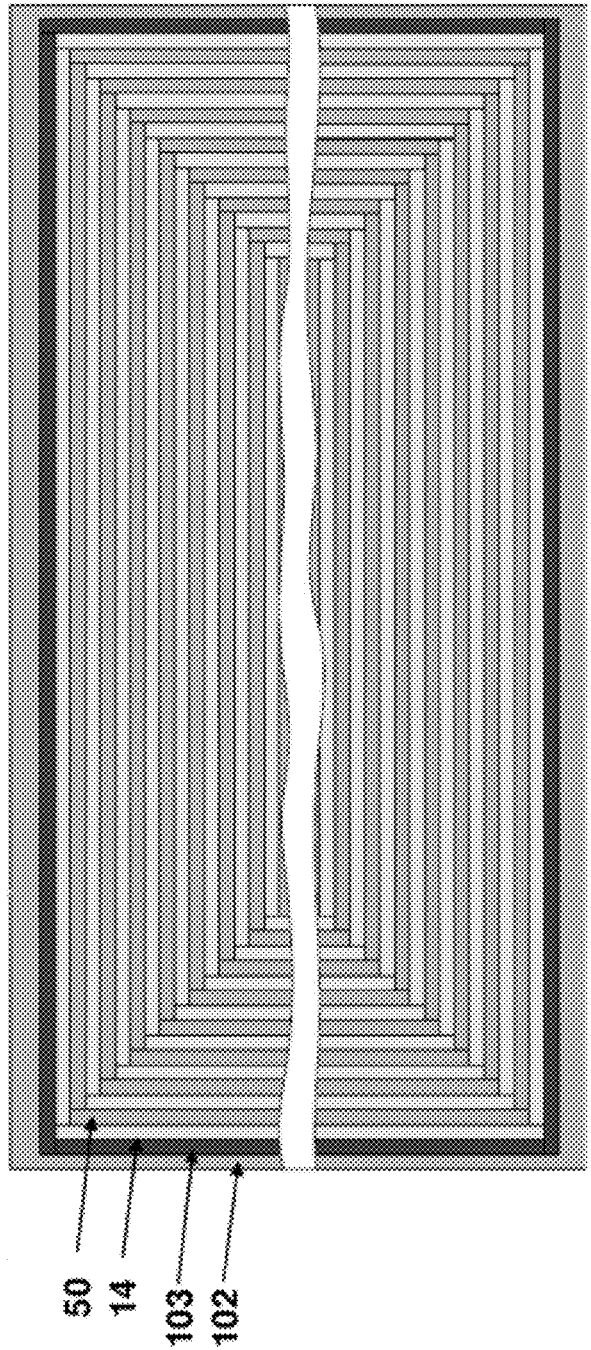

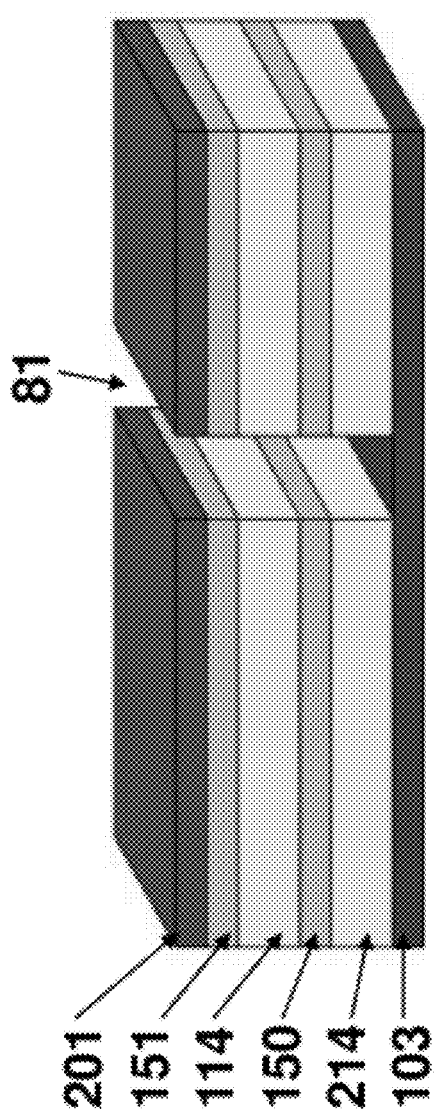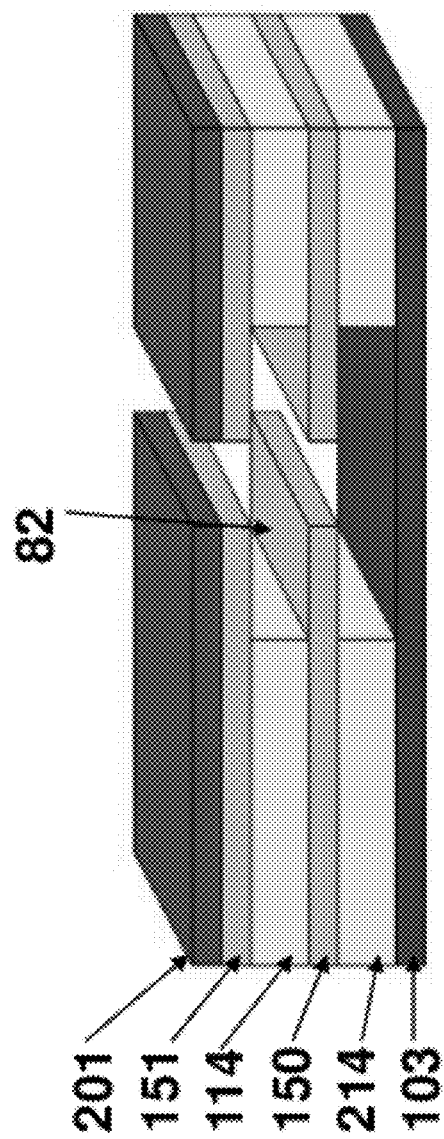

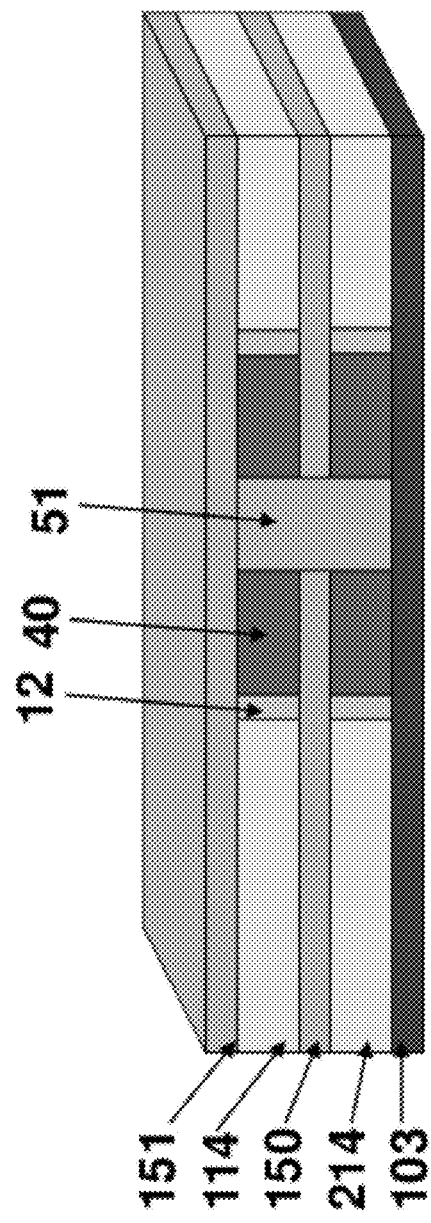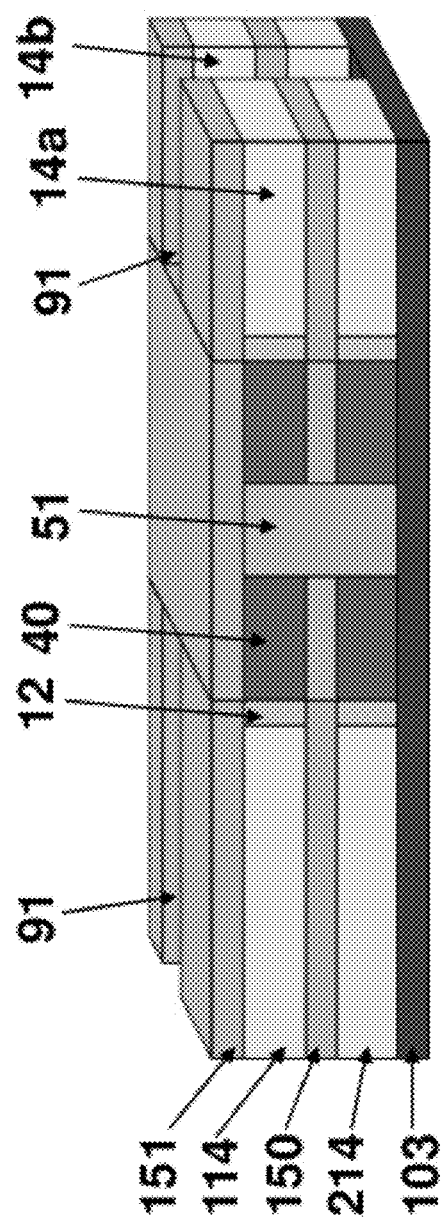

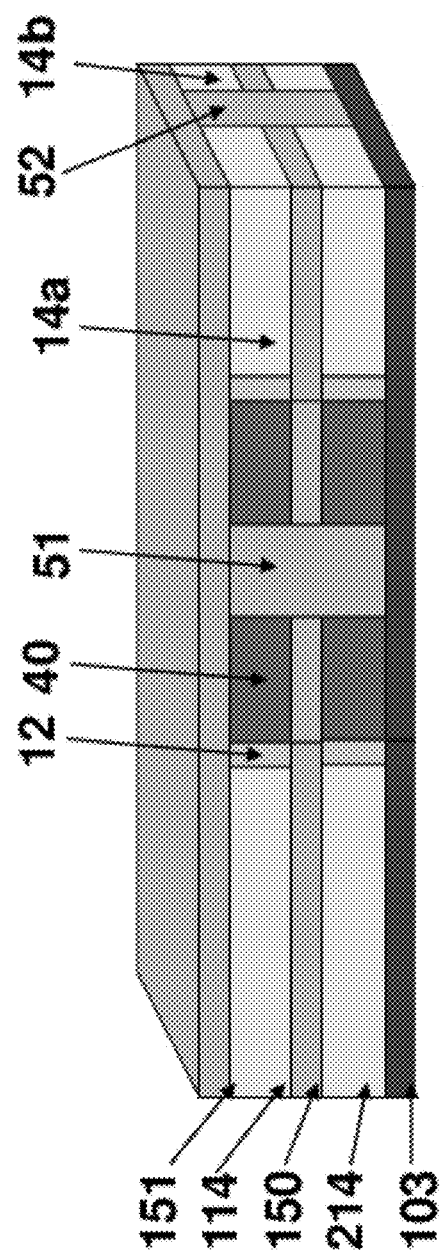
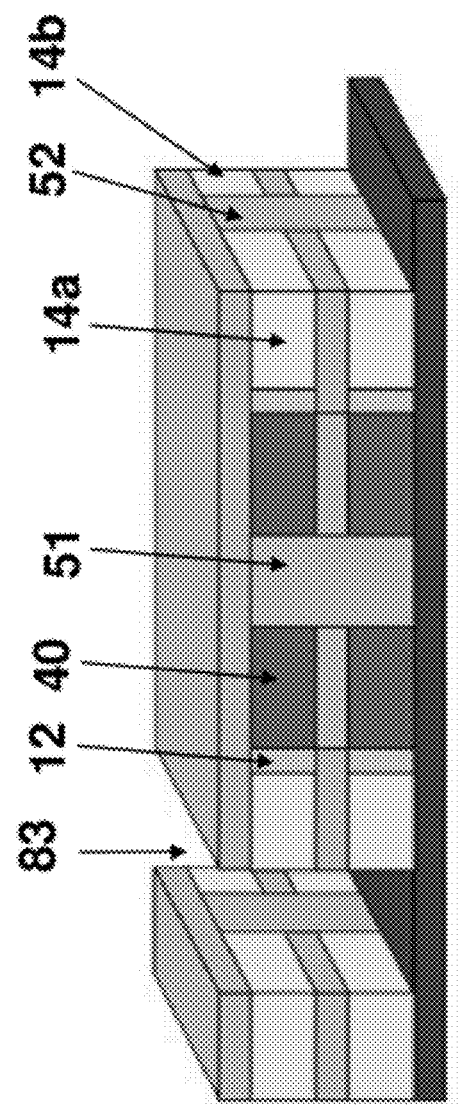

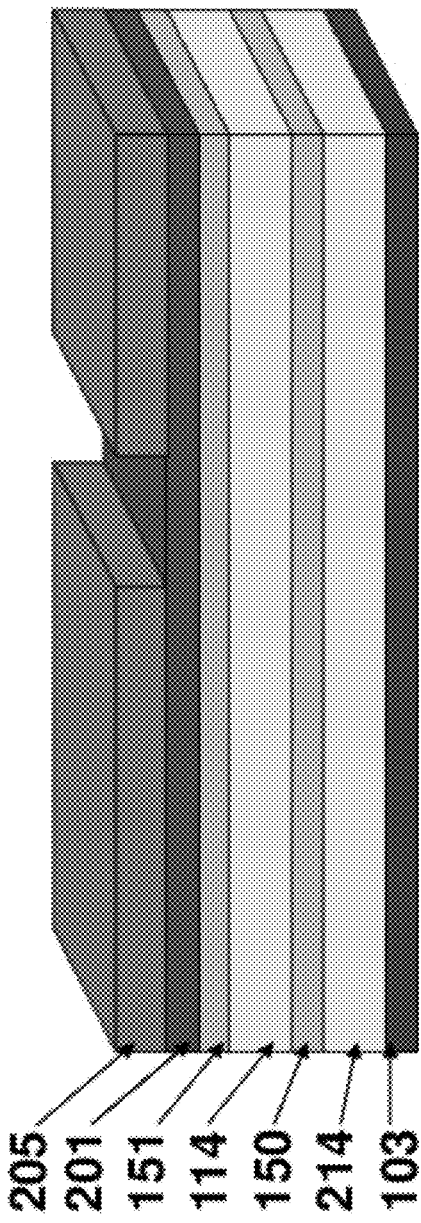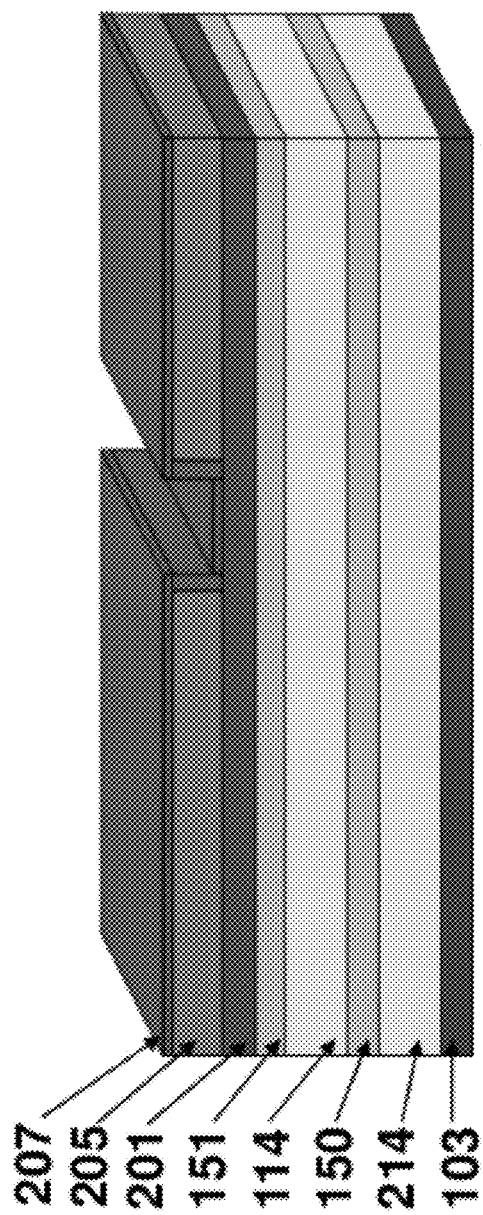

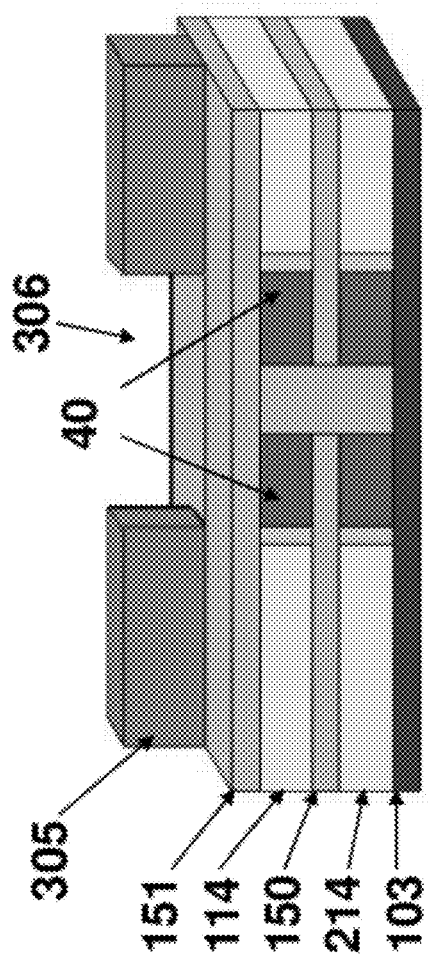
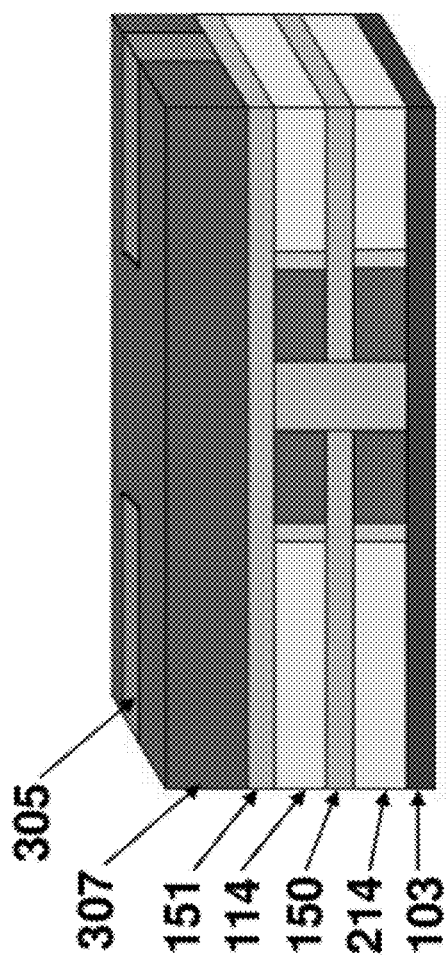

THREE DIMENSIONAL HORIZONTAL DIODE NON-VOLATILE MEMORY ARRAY AND METHOD OF MAKING THEREOF

BACKGROUND OF THE INVENTION

The invention relates generally to a semiconductor device and method of making thereof and more specifically to a three dimensional diode nonvolatile memory array and method of making thereof.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Memory cells may also vary in the number of data states each cell can achieve. A data state may be stored by altering some characteristic of the cell which can be detected, such as current flowing through the cell under a given applied voltage. A data state is a distinct value of the cell, such as a data '0' or a data '1'.

SUMMARY

One embodiment of the invention provides a non-volatile memory device comprising a three dimensional stack of horizontal diodes located in a trench in an insulating material, wherein each of the horizontal diodes is a steering element of a respective non-volatile memory cell of the non-volatile memory device, a plurality of storage elements, each of the plurality of storage elements located adjacent to a respective steering element, a plurality of word lines extending substantially vertically, and a plurality of bit lines, each of the plurality of bit lines have a first portion that extends up along at least one side of the trench and a second portion that extends substantially horizontally through the three dimensional stack of the horizontal diodes.

Another embodiment of the invention provides a non-volatile memory device comprising a three dimensional stack of horizontal diodes located in a trench in an insulating material comprising at least a first column of horizontal diodes and a second column of horizontal diodes, wherein each of the horizontal diodes is a steering element of a respective non-volatile memory cell of the non-volatile memory device, and a U-shaped storage material layer having a first wing and a second wing extending substantially vertically, wherein the first wing of the U-shaped storage material layer electrically contacts the first column of the horizontal diodes, and the second wing of the U-shaped storage material layer electrically contacts the second column of the horizontal diodes. Each horizontal portion of the U-shaped storage material layer which contacts a respective steering element of a non-volatile memory cell forms a storage element of the same non-volatile memory cell.

Another embodiment of the invention provides a method of making a non-volatile memory device comprising forming a stack of alternating layers of a first material and a second material in a trench of an insulating material, wherein the first material comprises a semiconductor material and wherein the second material is insulating, etching the stack to form at least one first rail-shaped opening in the stack, the at least one first rail-shaped opening extending in a first direction, selectively etching the first material exposed in the at least one first rail-shaped opening to form first recesses in the first material such that the second material overhangs the first recesses, doping a first outer portion of the first material exposed in the first recesses to form first conductivity type semiconductor portions of diodes, forming a first conductive material in the first recesses and in the at least one first rail-shaped opening, removing a portion of the first conductive material that is located in the at least one first rail-shaped opening to form separate horizontal bit lines in the first recesses, forming a first insulating filling material in the at least one first rail-shaped opening, etching the stack to separate the first material into a plurality of semiconductor features extending in a second direction different from the first direction, forming a second insulating filling material between the plurality of semiconductor features, etching the stack to form at least one second rail-shaped opening in the stack, the at least one second rail-shaped opening extending in the first direction, doping a second outer portion of the first material exposed in the at least one second rail-shaped opening to form second conductivity type semiconductor portions of the diodes, forming a storage material on a side wall of the at least one second rail-shaped opening in electrical contact of the second conductivity type semiconductor portions of the diodes such that at least a middle portion of the at least one second rail-shaped opening remains unfilled, forming a second conductive material in the middle portion of the at least one second rail-shaped opening in electrical contact with the storage material, and etching the second conductive material to form separate word lines extending substantially vertically.

Another embodiment of the invention provides a method of making a non-volatile memory device comprising forming a three dimensional stack of horizontal diodes in a trench in an insulating material, forming a plurality of storage elements, each of the plurality of storage elements located adjacent to a respective steering element, forming a plurality of substantially vertical word lines, and forming a plurality of bit lines which have a first portion that extends up along at least one side of the trench and a second portion that extends substantially horizontally through the three dimensional stack of horizontal diodes.

BRIEF DESCRIPTION OF THE DRAWINGS

FIG. 2A is a top cross-sectional view along Plane A-A' in FIG. 1, according to one embodiment of the invention. FIG. 2B is a side cross-sectional view along Line B-B' in FIG. 2A.

FIG. 3A is a top cross-sectional view along Plane A-A' in FIG. 1, according to an alternative embodiment of the invention. FIG. 3B is a side cross-sectional view along Line B-B' in FIG. 3A according to this alternative embodiment.

FIGS. 5A (a side cross-sectional view) and 5B (a top cross-sectional view) show a starting structure for forming a memory array according to one embodiment of the invention.

FIGS. 6A-6M are three dimensional cross sectional views illustrating stages in formation of a memory array according to one embodiment of the invention.

FIGS. 7A-7B are side cross sectional views illustrating stages in formation of a memory array according to an alternative embodiment of the invention.

FIGS. 8A-8B are side cross sectional views illustrating stages in formation of a memory array according to another alternative embodiment of the invention.

DETAILED DESCRIPTION OF THE EMBODIMENTS

Embodiments of the present invention will be described below with reference to the accompanying drawings. It should be understood that the following description is intended to describe exemplary embodiments of the invention, and not to limit the invention.

A three dimensional diode containing nonvolatile memory array may include an array of semiconductor diodes, each of which is disposed substantially parallel to the substrate surface (i.e., disposed horizontally). A non-limiting example of a three dimensional diode nonvolatile memory array is shown in FIG. 1 (a perspective view), FIG. 2A (a top cross-sectional view along Plane A-A' in FIG. 1), FIG. 2B (a side cross-sectional view along Line B-B' in FIG. 2A) and FIG. 2C (a side cross-sectional view along Line C-C' in FIG. 2A).

Figure 1:
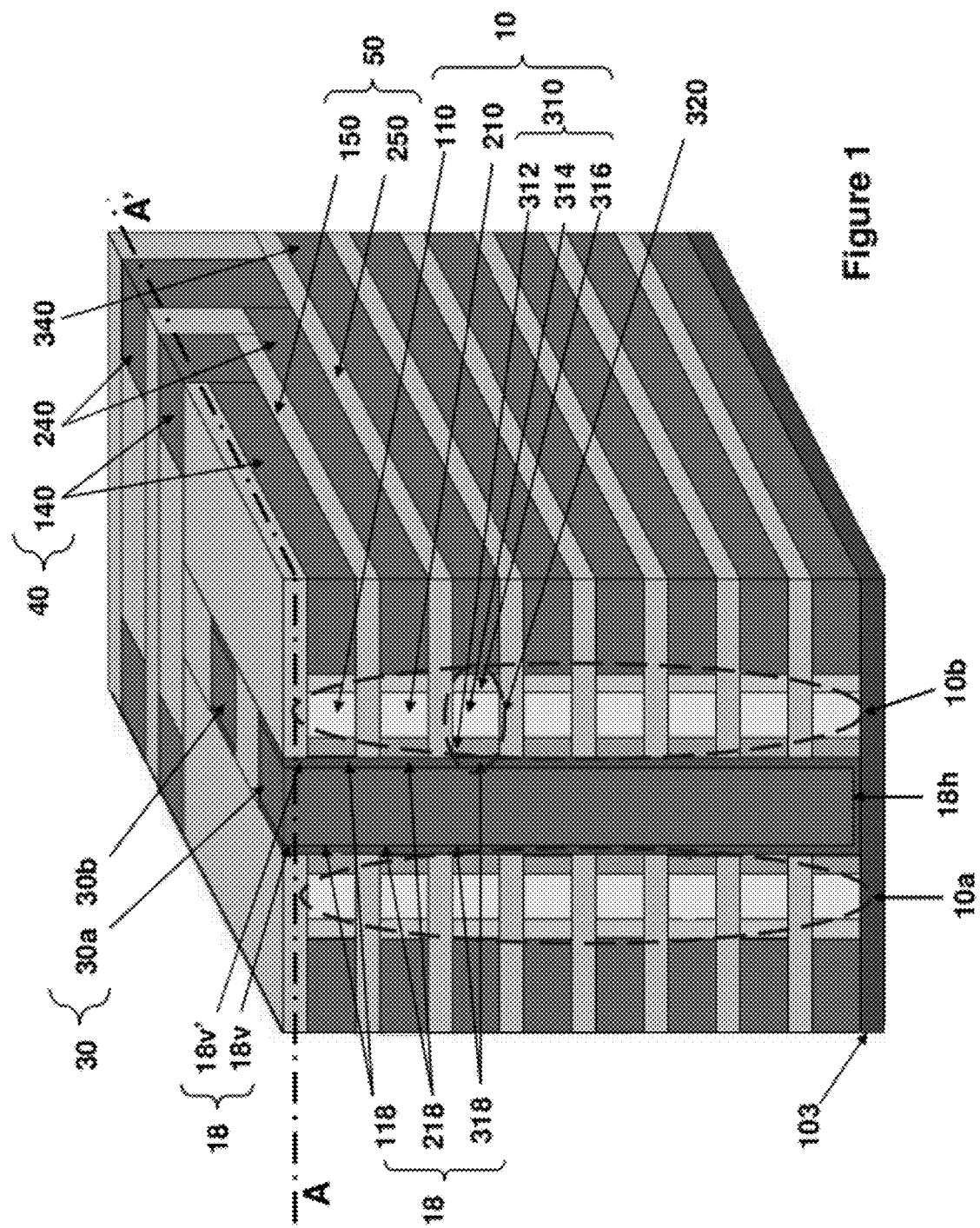
FIG. 1 is a perspective view of a three dimensional diode containing nonvolatile memory array according to one embodiment of the invention.
Figure 2C:
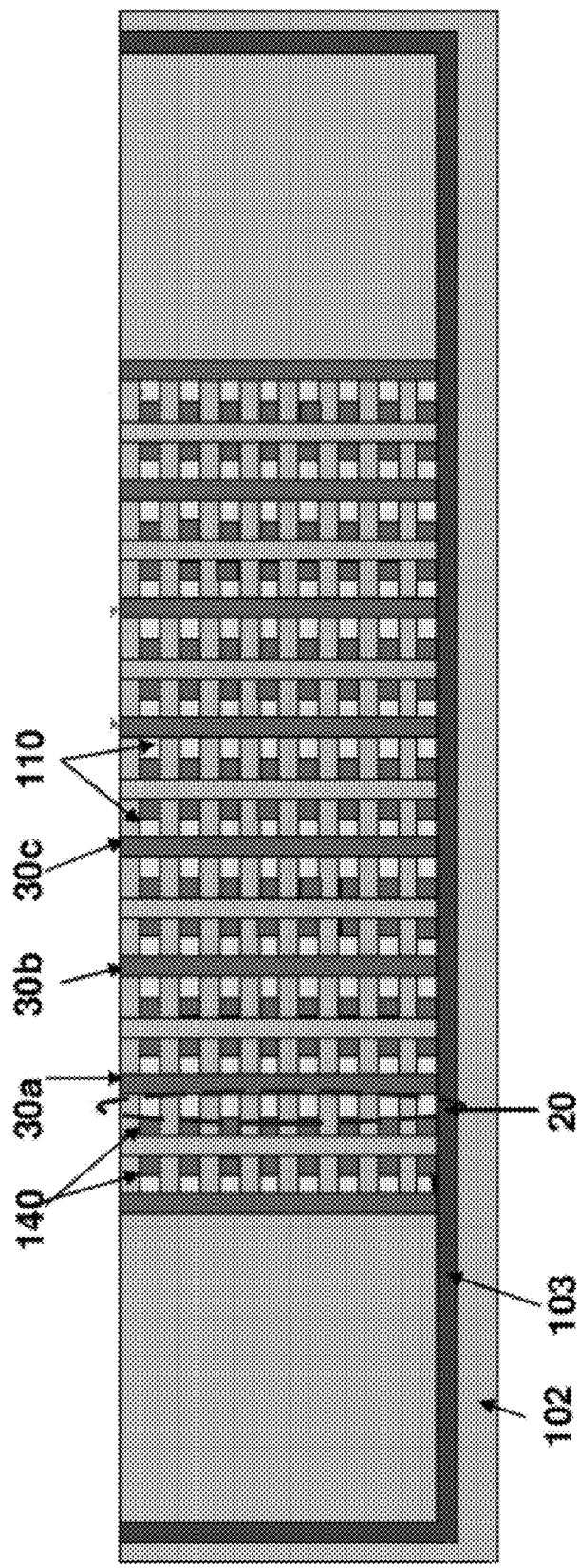
FIG. 2C is a side cross-sectional view along Line C-C' in FIG. 2A.

As shown in FIG. 1, a three dimensional diode nonvolatile memory array may comprise a three dimensional stack of horizontal diodes 10 (e.g., 110 in a first or top device level, 210 in a second device level below the first device level, 310 in a third device level below the second device level, etc.) located in a trench 102A in an insulating material 102 (as shown in FIGS. 2A-2C) over a substrate 101 (as shown in FIG. 2B). The trench may have a bottom surface which is substantially parallel to a major surface of the substrate.

The substrate 101 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device. The insulating material 102 may be any electrically insulating material, such as silicon oxide, silicon nitride, silicon oxynitride, or other high-k insulating materials. As shown in FIGS. 1 and 2A-2C, an optional silicon nitride liner 103 may be disposed between the three dimensional stack of horizontal diodes 10 and the insulating material 102, such as a silicon oxide material. In some embodiments, the silicon nitride liner 103 may be omitted, if desired.

Each of the horizontal diodes 10 is a steering element of a respective non-volatile memory cell of the non-volatile memory array. Any suitable semiconductor materials can be used for the horizontal diodes 10, for example silicon, germanium, silicon germanium, or other compound semiconductor materials, such as III-V, II-VI, etc. materials. The semiconductor material may be amorphous, polycrystalline or single crystal. The semiconductor material may be formed by any suitable deposition methods. For example, in one embodiment, the semiconductor material is deposited by low pressure chemical vapor deposition (LPCVD). The horizontal diodes 10 may be p-i-n diodes having an intrinsic region 14, 314 which is not intentionally doped located between n-type regions 12, 312 and p-type regions 16, 316 as shown in FIGS. 6M and 1, respectively. In some other embodiments, the intrinsic region 14, 314 may be omitted, and the diodes 10 are p-n diodes. The horizontal diodes 10 are disposed substantially parallel to the major surface 101A of the substrate 100, such that direction from a p-type region to an n-type region of each of the horizontal diodes is substantially parallel to the major surface of a substrate and also substantially parallel to the top surface 102B of the trench in the insulating material 102. The horizontal diodes 10 in adjacent device levels which are stacked in a direction perpendicular to surfaces 101A and 102B are separated from each other by interlayer insulating layers 50. For example, the horizontal diodes 110 in a first device level are separated from the horizontal diodes 210 in a second device level located below the first device level 110 by an interlayer insulating layer 150.

The memory array may also include a plurality of storage elements 118 in the first device level, 218 in the second device level, 318 in the third device level, etc. Each of the plurality of storage elements 118, 218, 318 is located adjacent to a respective diode steering element 110, 210, 310 in the respective device level. In some embodiments, the plurality of storage elements comprise horizontal portions of at least one U-shaped storage material layer located in a trench in the three dimensional stack of horizontal diodes 10. In other words, each horizontal portion 118, 218, 318, etc. of the U-shaped storage material layer 18 which contacts a respective steering element 110, 210, 310 of a non-volatile memory cell (e.g., 20, 320) forms a storage element of the same non-volatile memory cell. For example, the cell 320 in the third device level comprises a p-i-n diode 310 steering element containing respective n-type, intrinsic and p-type regions 312, 314, 316, and a storage element 318 comprising a horizontal portion of layer 18. The U-shaped storage material layer 18 comprises a first wing 18v and a second wing 18v' extending substantially vertically (i.e., substantially perpendicular to surfaces 101A and 102B). The first wing 18v of the at least one U-shaped storage material layer contacts a first column of the horizontal diodes 10a, and the second wing 18v' of the at least one U-shaped storage material layer contacts a second column of the horizontal diodes 10b. The wings 18v and 18v' are connected by a horizontal portion 18h which is substantially parallel to surfaces 101A and 102B.

The plurality of storage elements 118, 218, 318 may comprise at least one of antifuse, fuse, metal oxide resistivity switching material (e.g., nickel oxide), complex metal oxide resistivity switching material, carbon nanotube switching material, graphene resistivity switching material, carbon resistivity switching material, phase change resistivity switching material, conductive bridge element, or polymer resistivity switching material. In some embodiments, the storage elements comprise antifuse dielectric layer that contains one of hafnium oxide, zirconium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or a combination thereof.

The memory array may further include a plurality of word lines 30 (e.g., 30a, 30b, etc. shown in FIGS. 1 and 2C) and a plurality of bit lines 40 (e.g., 140, 240, 340, etc. shown in FIGS. 1 and 2B). The plurality of bit lines 40 and word lines 30 may comprise any suitable conductive materials, for example tungsten, copper, aluminum, tantalum, titanium, cobalt, titanium nitride or alloys thereof. For example, in some embodiments, tungsten may be used to allow processing under a relatively high temperature. In some other embodiments, copper or aluminum may be used.

As shown in FIGS. 1 and 2C, the plurality of word lines 30 extend substantially vertically (i.e., substantially perpendicular to the major surface 101A of the substrate 100). Each word line 30 electrically contacts a first side of a column of memory cells 20 (each column includes the diode steering elements 10a, 10b and a respective portion of the storage material layer 18v, 18v'), as shown in FIGS. 1 and 2C. For example, as shown in FIGS. 1 and 2C, the word line 30a electrically contacts the storage element side of the memory cells 20, 320 (i.e., word line located on the side of storage elements 118, 218, 318, etc.). Alternatively, the word lines may contact a column of memory cells on the diode side.

The plurality of bit lines 40 (e.g., 140, 240, 340, etc.) electrically contact the horizontal diodes 10 (e.g., 110, 210, 310, etc. shown in FIG. 1). As shown in FIG. 2B, each of the plurality of bit lines 40 has a first portion (v portion) that extends substantially vertically up along at least one side of the trench in material 102 and a second portion (h portion) that extends substantially horizontally through the three dimensional stack of the horizontal diodes 10. The plurality of bit lines 40 are separated from each other by at least one of a plurality of insulating layers 50 (150, 250, 350, etc.). Each of the plurality of insulating layers 50 has a first portion (v portion) that extends substantially vertically up along at least one side of the trench and a second portion (h portion) that extends substantially horizontally through the three dimensional stack of the horizontal diodes 10 and separates the diodes and the bit lines 40 in the vertical direction. The vertical portions of each pair of the bit lines 40v that are located adjacent to each other are separated by the vertical portion of a respective one of the plurality of insulating layers 50v, and the horizontal portions of each pair of the bit lines 40h that are located adjacent to each other are separated by the horizontal portion of a respective one of the plurality of insulating layers 50h.

Figure 4A:
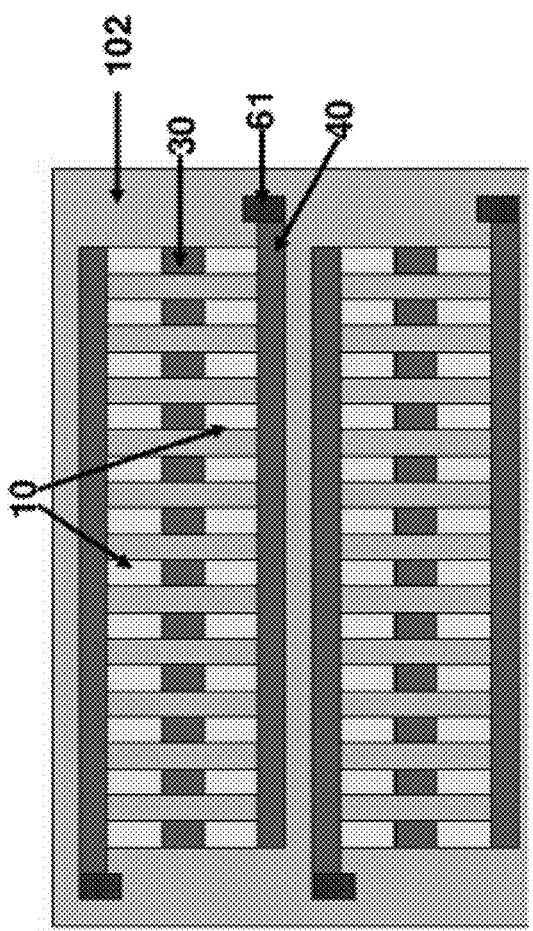
FIGS. 4A-4B are top views of memory arrays having electrical contacts according to two embodiments of the invention, respectively.

As shown in FIGS. 2A, 2B and 4A, each bit line 40a, 40b, 40c contains one vertical portion which is exposed on one side of the device region 200 where the memory cells are located. The horizontal portions of each bit line are offset in the direction parallel to Line C-C' in FIG. 2A. For example, bit line 40a having a vertical portion on one (e.g., left) side of the device region has a horizontal portion located between horizontal portions of bit lines 40b, 40c as viewed along line C-C'. Bit lines 40b and 40c have vertical portions on the opposite (right) side of the device area from the location of the vertical portion of bit line 40a. Alternatively, rather than having only one vertical portion (e.g., v portion shown in FIG. 2B), the bit lines 40 may have two vertical portions (portions v and v'), as shown in FIGS. 3A (a top cross-sectional view along Plane A-A' in FIG. 1), 3B (a side cross-sectional view along Line B-B' in FIG. 3A) and 4B. As shown in these figures, each bit line 40 has vertical portions exposed on opposite sides of the device region 200A and a horizontal portion in the device region connecting the vertical portions.

Figure 4B:
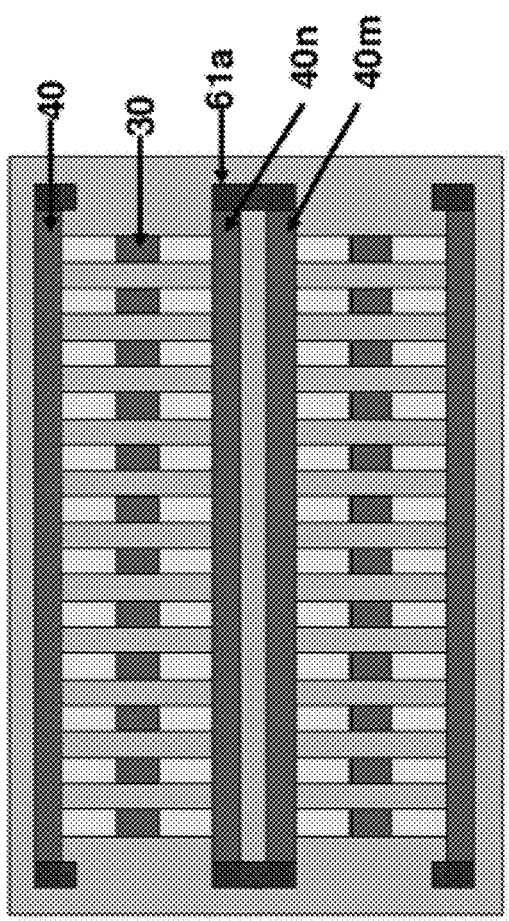

Turning to FIG. 4A, the memory array may further comprise a plurality of first electrical contacts 61 to the first, substantially vertical portion (i.e., v portion) of the plurality of bit lines 40, and a plurality of second electrical contacts (not shown) to the plurality of word lines 30. In some alternative embodiments, at least one of the electrical contacts is electrically connected to the substantially first portion (i.e. v portion) of at least two of the plurality of bit lines located adjacent to each other in a same device level. For example, as shown in FIG. 4B, electrical contact 61a electrically contacts adjacent bit lines 40n and 40m.

Another embodiment of the invention provides a method of making the above described non-volatile memory array. The method comprises forming a three dimensional stack of horizontal diodes in a trench in an insulating material, forming a plurality of storage elements, each of the plurality of storage elements located adjacent to a respective steering element, forming a plurality of substantially vertical word lines, and forming a plurality of bit lines which have a first portion that extends up along at least one side of the trench and a second portion that extends substantially horizontally through the three dimensional stack of horizontal diodes.

In some embodiments, a starting structure for making the nonvolatile memory array described above may be obtained by forming an optional liner 103 in a trench of an insulating material 102, followed by forming alternating semiconductor material layers 14 (e.g., 114, 214, 314 etc.) and insulating layers 50 (e.g., 150, 250, 350, etc.), resulting in a structure shown in FIGS. 5A (side cross-section view) and 5B (top cross-sectional view). Vertical portions of the layers 14 and 50 are formed at the edges of the trench as shown in FIGS. 5A.

Figure 6A:
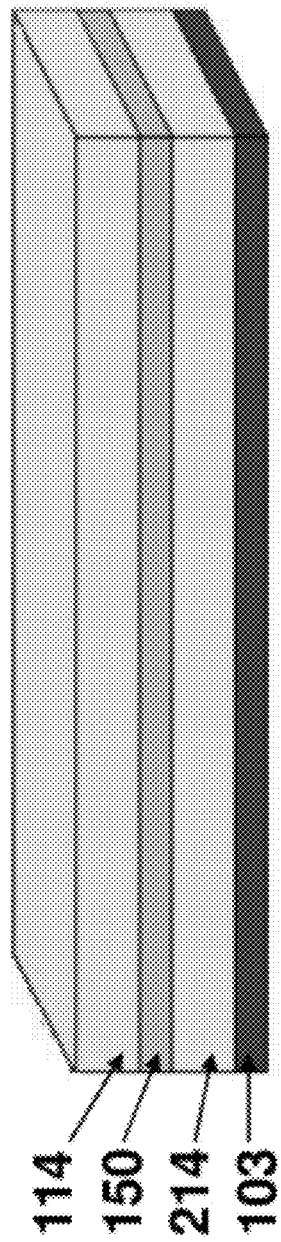
Figure 6B:
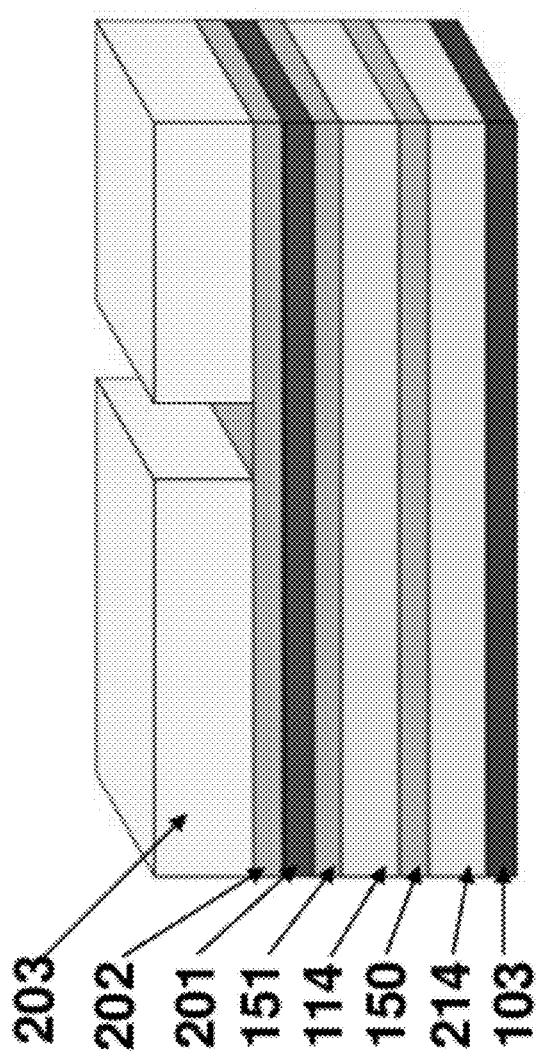

FIG. 6A shows a perspective view of a center portion of the structure shown in FIGS. 5A-5B (e.g., part of device region 200 or 200A). In a non-limiting example, the liner 103 is 25 to 75 nm, such as 50 to 60 nm thick silicon nitride, and the insulating layers 50 are 15 to 40 nm, such as 24 to 35 nm silicon oxide layers, while the semiconductor material layers 14 are 20 to 80 nm, such as 40 to 60 nm undoped (i.e., intrinsic) polysilicon layers. Of course, one of ordinary skill in the art would understand any other desired combination of materials and thickness of layers may be used. The layers may be stacked in any number of device levels, such as 2 to 16 levels. For example, 8 device levels are shown in FIG. 1.

FIGS. 6A-6M show perspective views illustrating stages in formation of a memory array according to one embodiment of the invention. In the below description, an intrinsic (i.e., not intentionally doped) semiconductor material is used for the semiconductor material 14 as a non-limiting example. FIG. 6A shows the first and second device level polysilicon layers 114, 214 separated by a silicon oxide insulating layer 150 over the silicon nitride liner/etch stop 103.

A top insulating layer 151, such as another silicon oxide layer, a hard mask 201, and an optional bottom anti-reflective coating BARC layer 202 can then be formed over the semiconductor layer 114 (i.e., over the stack of alternative layers of semiconductor material 14 and insulating layers 50). In a non-limiting example, a high etch/CMP selectivity mask may be used, for example a 100 to 150 nm, such as 120 to 130 nm silicon nitride hard mask and a 100 to 150 nm, such as 120 to 130 nm amorphous carbon advanced patterning film (APF). Photoresist mask patterns 203 can be formed over the stack by coating a photoresist layer, photolithographically exposing the photoresist layer, and patterning the photoresist layer to form mask patterns 203, resulting in a structure shown in FIG. 6B.

The stack of alternative semiconductor material layers 14 and insulating layers 50 is then etched using the photoresist mask patterns 203 and/or hardmask 201 patterns and/or BARC 202 patterns as a mask to form at least one first rail-shaped opening 81 in the stack, the at least one first rail-shaped opening 81 extending in a first direction, resulting in a structure shown in FIG. 6C. In some embodiments, the remaining hard mask 201 may be stripped after the step of etching the stack. In other embodiments in may be retained for further steps. Unless specified otherwise, all other patterning steps described below may be performed by photolithographically forming the hardmask and photoresist patterns followed by etching the underlying layer(s) using the patterns as a mask.

Turning to FIG. 6D, the semiconductor material layers 14 exposed in the at least one first rail-shaped opening 81 can then be selectively etched to form first recesses 82 in the semiconductor material layers 14 such that the insulating material 50 overhangs the first recesses 82. The selective etching of the semiconductor material 14 exposed in the rail-shaped openings 81 may be achieved by any desirable methods to form first recesses 82. For example, in some embodiments, an outer portion of the first material 14 exposed in the rail-shaped opening 81 is n-type doped, followed by selectively wet etching the n-type doped outer portions without etching the intrinsic material 14 to form first recesses 82. In a non-limiting example of this embodiment, an outer portion of the intrinsic polysilicon material 14 is n-type doped with phosphorus using $PH_3$ as source gas, and the n-type doped portions can then be selectively etched by wet etching using $126\ HNO_3$: $60\ H_2O$: $5NH_4F$ or a diluted etchant if a lower etch rate is desired. In some other embodiments, the step of selective etching of the semiconductor material 14 exposed in the rail-shaped openings 81 may comprise nitriding an outer portion of the semiconductor material 14 and selectively removing the nitrided outer portion exposed in the rail-shaped opening 81 using any selective etching medium which selectively etches silicon nitride over polysilicon or silicon oxide. Alternatively, if material 50 comprises silicon nitride rather than silicon oxide, then the step of selective etching of the semiconductor material 14 exposed in the rail-shaped openings 81 may comprise oxidizing an outer portion of the semiconductor material 14 and selectively removing the oxidized outer portion exposed in the rail-shaped opening 81 using any selective etching medium which selectively etches silicon oxide over polysilicon or silicon nitride. Any other suitable etching methods may be used, such as a timed selective wet etch which recesses the polysilicon but does not etch silicon oxide.

Figure 6E:
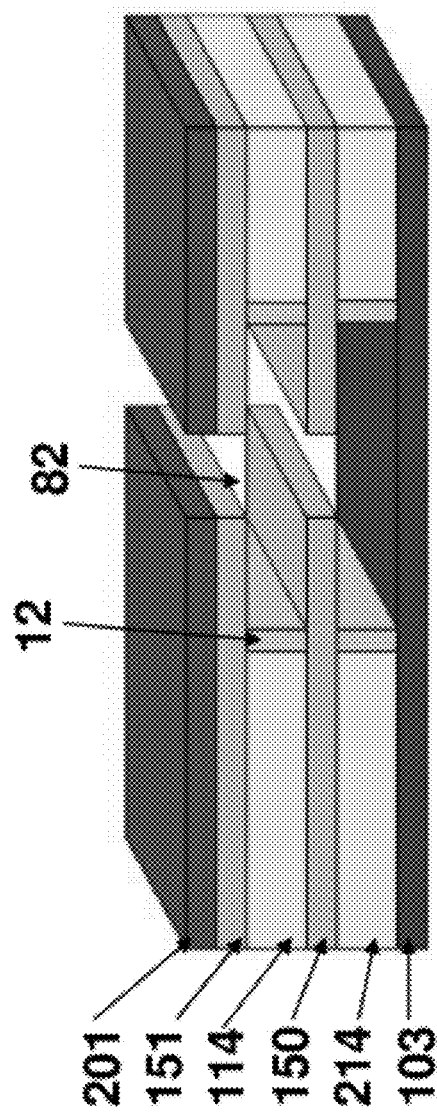

Next, an outer portion of the remaining semiconductor material layers 14 that is exposed in the first recesses 82 is doped to a first conductivity type (e.g., n-type), resulting in n-type regions 12 in a structure shown in FIG. 6E. N-type regions may be doped with phosphorus using $PH_3$ as a source gas.

Figure 6F:
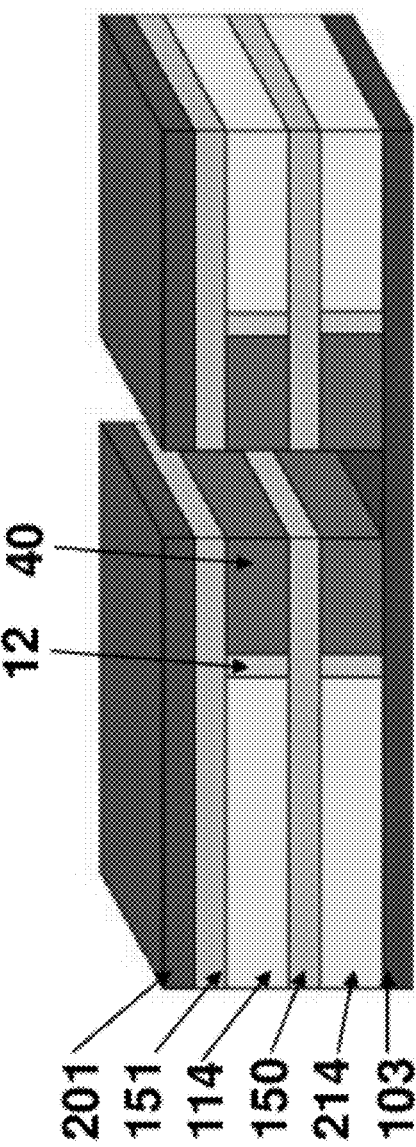

A first conductive material can then be formed in the openings 81 and in the first recesses 82 to form separate horizontal bit lines 40 in the first recesses 82, resulting a structure shown in FIG. 6F. For example, the bit lines may formed by CVD of tungsten. In some embodiments, a barrier layer (not shown) such as a TiN barrier layer may be formed by CVD prior to the step of forming the tungsten in the recesses. In a non-limiting example of these embodiments, around 2-5 nm, such as 3-4 nm TiN may be deposited prior to depositing around 40 to 80 nm, such as 60 to 70 nm of tungsten to form the bit lines 40.

The separate horizontal bit lines 40 may be formed by any desirable method. For example, in some embodiments, the separate horizontal bit lines 40 can be formed by forming the first conductive material (e.g., forming TiN and W by CVD) in the first recesses 82 and in the at least one first rail-shaped opening 81, followed by optionally planarizing the deposited layers by CMP or another suitable method using the silicon nitride hardmask as a polish stop, followed by removing the portion of the first conductive material located in the first rail-shaped opening 81 by anisotropic etching. The overhanging insulating material 151 acts as a mask to prevent etching of the conductive material (e.g., TiN/W) in the recesses 82. The conductive material remaining in the recesses 82 forms the horizontal portions of the bit lines 40. In these embodiments, seam defects formed in the first conductive material in the first rail-shaped opening 81 are tolerable, because that portion of the first conductive material is removed during the etching process.

An insulating filling material 51 can then be formed in the first rail-shaped openings 81, resulting in a structure as shown in FIG. 6G. The insulating filling material 51 may be formed by any desired methods. For example, one or more of CVD, spin-on coating, etc., methods may be used if desired. A planarization step (e.g., CMP) and an optional curing step (for spin on PSZ deposited layer) may be performed after the step of forming the insulating filling material 51 in the trench.

Turning to FIG. 6H, the stack of layers can then be etched to separate the semiconductor material 12/14 into a plurality of semiconductor features (e.g., 14a, 14b, etc.) extending in a second direction different from the first direction. In other words, the diode semiconductor material 12/14 is separated laterally by trenches or openings 91 which extend in a perpendicular direction from that of openings 81. The etching step exposes the side wall of the horizontal bit lines 40 in the openings 91 between the semiconductor features 12/14. Etch masks and methods similar to those described above to form first rail-shaped openings 81 may be used in this step, except that the mask covers the entire area of the bit lines so that the bit lines are not etched in the device area.

Next, a second insulating filling material 52 is then formed in openings 91 between the plurality of semiconductor features (e.g., 14a and 14b), resulting in a structure as shown in FIG. 6I. The insulating material may comprise silicon oxide which is deposited over the stack and then planarized by CMP or other methods using the hardmask as a polish stop.

Figure 6K:
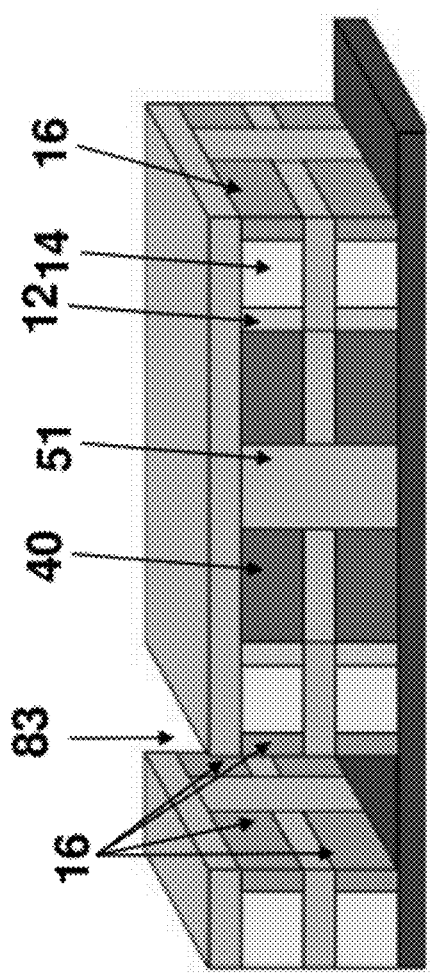
Figure 6L:
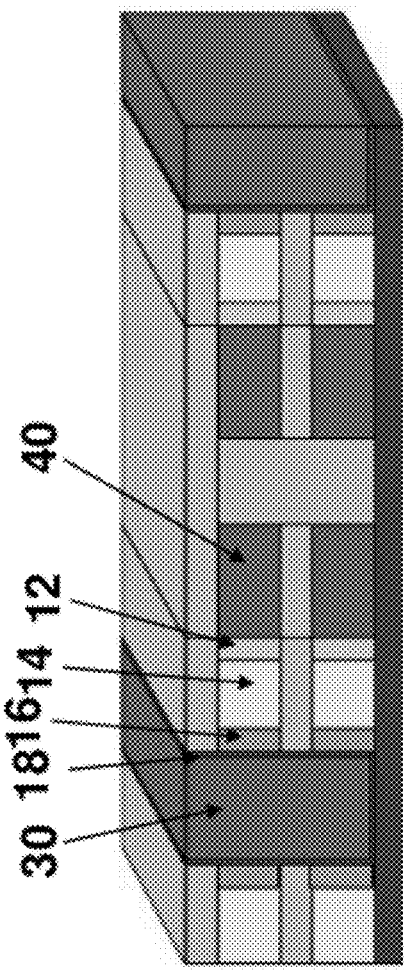
Figure 6M:
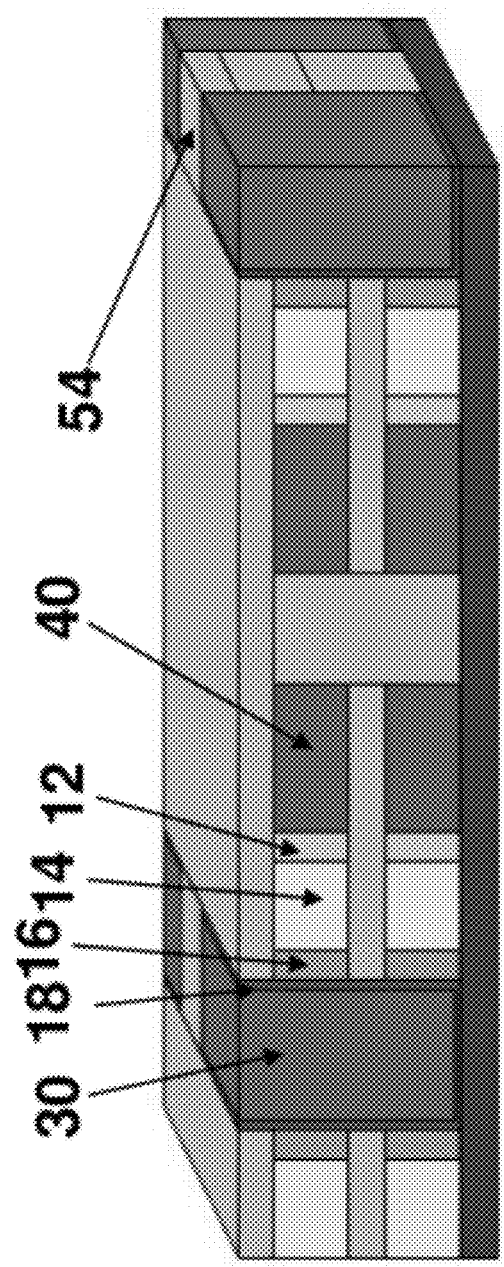

The stack is then etched to form at least one second rail-shaped opening 83 extending in the first direction parallel to the direction of openings 81 and perpendicular to the direction of openings 91, as shown in FIG. 6J. Etch masks and methods similar to those described above to form first rail-shaped openings 81 may be used in this step. A second outer portion of the semiconductor material 14 exposed in the second rail-shaped opening 83 can then be doped second conductivity type (e.g., p-type) to form second conductivity type diode regions 16, as shown in FIG. 6K. $B_2H_6$ gas may be used to dope regions 16. The second conductivity type is different from the first conductivity type. For example, if the first conductivity type is n-type, then the second conductivity type is p-type, and vise versa. In some embodiments, the semiconductor material 14 is intrinsic such that the first outer portion 12, the updoped middle portion 14, and the second outer portion 16 form n-i-p or p-i-n diodes.

A U-shaped storage material layer 18 is then formed on a side wall and bottom of the second rail-shaped opening 83, while at least a middle portion (i.e., the middle of the U-shape) of the second rail-shaped openings 83 remains unfilled. The storage material layer 18 is in electrical contact of the second conductivity type semiconductor portions 16 of the diodes. As noted above, layer 18 may comprise any resistivity switching material layer, such as a silicon oxide antifuse layer, nickel oxide switching material, carbon or carbon nanotube material, etc. Further, a second conductive material 30 is formed in the unfilled middle portion of the second rail-shaped openings 83 in electrical contact with the storage material layer 18, resulting in a structure shown in FIG. 6L. During these deposition steps, the top and bottom "electrode" conductive materials (not shown) of for the storage element may be deposited in the openings 83. For example, Ti/TiN/storage material/TiN/W layers may be deposited in the openings, where W forms the word line material and Ti and TiN form the storage element "electrodes".

The second conductive material 30 can then be planarized (e.g., by CMP) and then etched to form separate word lines 30 extending substantially vertically, as shown in FIG. 6M. The step of etching the second conductive material 30 etches the second conductive material 30 for the full trench height to completely separate word lines 30 from each other. In a non-limiting example, a photolithographically patterned silicon nitride hard mask may be used for this relatively long etching step.

Insulating filling material 54 can then be formed between the separate word lines 30, resulting in a structure shown in FIG. 6M. The openings between the word lines 30 may be overfilled by the insulating filling material 54 first, followed by a planarization (e.g., CMP) step.

In the non-limiting example shown in FIGS. 6A-6M, the step of selectively etching the semiconductor material 14 forms the first recesses 82 in at least two device levels at the same time, the step of doping the first outer portion 12 of the semiconductor material 14 dopes the first outer portion of the semiconductor material 14 in at least two device levels at the same time, the step of doping the second outer portion of the semiconductor material 14 dopes the second outer portion 16 of the semiconductor material 14 in at least two device levels at the same time, and the step of forming storage material forms storage elements 18 in more than two device levels at the same time. Of course, more than two, such as three to eight, or even more device levels may be fabricated at the same time using the above described methods. One advantage of the above described methods is that number of fabrication steps and aspect ratio of the process may be reduced, comparing to those of conventional methods.

A plurality of first electrical contacts 61 to the plurality of bit lines 40 and a plurality of second electrical contacts (not shown) to the plurality of word lines 30 can then be formed (see e.g., FIGS. 4A and 4B). The contacts may be formed by deposition of a conductive layer(s) (e.g., TiN/W) and photolithography/etching. In some embodiments, each of the plurality of the first electrical contacts 61 is electrically connected to at least one of the plurality of bit lines 40, resulting in the structure shown in FIG. 4A. Alternatively, each of the plurality of the first electrical contacts 61 is electrically connected to at least two of the plurality of bit lines located adjacent to each other in a same device level, resulting in the structure shown in FIG. 4B.

In an alternative embodiment, the step of etching the stack to form the first rail-shaped openings 81 comprises forming a first mask pattern over the stack, forming a first spacer layer over the first mask pattern, and etching the stack using a combination of the first mask pattern and the first spacer layer as a mask. For example, a first mask pattern 205, such as a silicon nitride pattern, may be formed over the stack by photolithography and etching, as shown in FIG. 7A. A spacer layer 207, such as a silicon oxide or metal layer can then be formed over the first mask pattern, resulting in a structure shown in FIG. 7B. The combination of the first mask pattern 205 and the spacer layer 207 can then be used as a mask to etch the stack to form rail shaped openings 81 with a narrower width than those shown in FIG. 6C.

Similarly, the same type of mask pattern 205 and spacer layer 207 may be used to form rail-shaped openings 83 with a narrower width than those shown in FIG. 6J and/or to etch the word lines 30 with a narrower width than those shown in FIG. 6M. For example, the step of etching the stack to form the second rail-shaped openings 83 may comprise forming a second mask pattern over the stack, forming a second spacer layer over the second mask pattern, and etching the stack using a combination of the second mask pattern and the second spacer layer as a mask.

In some other embodiments, the step of etching the stack to form the openings 91 shown in FIG. 6H may comprise forming rail-shaped mask features 305 over the stack, as shown in FIG. 8A. The rail-shaped mask features 305 extend in the second direction. Then, spacers 307 can be formed between the rail-shaped mask features 305, resulting in a structure shown in FIG. 8B. The rail-shaped mask features 305 can then be removed. This leaves the spacers 307 having rail shaped opening(s) where features 305 were located over the stack. The spacers 307 can then be used as a mask for etching the stack to form openings 91, to form the structure shown in FIG. 6H. It should be noted that the rail shaped features 305 may have a discontinuity 306 over the bit line 40 locations. This allows the spacers 307 to completely cover the bit line 40 locations to prevent etching of the bit lines. Alternatively, the discontinuity 306 is omitted and the features 305 are continuous. In this case, the spacers 307 have an opening exposing the bit line 40 locations. Thus, a separate cut mask is used to cover the bit line locations to prevent bit line etching during the etching of openings 91.

Of course, any other methods, if desired, may be used for forming the etch masks, for example, simple photoresist features, rather than the spacer features or a combination of spacer features and mask pattern described above, may be used as masks in one or more etch steps.

In the above described non-limiting examples, each non-volatile memory cell of the non-volatile memory array includes a storage element (e.g., 118) disposed in series with a semiconductor diode (e.g. 110), as shown in FIG. 1. In operation, the storage element 118 is adapted to change resistivity state in response to an external voltage pulse to write or erase a data bit.

Alternatively, the storage element may be omitted, such that each non-volatile memory cell may be made up solely of one semiconductor diode from the array of semiconductor diodes. In operation, the semiconductor diode is adapted to change resistivity state in response to an external voltage pulse to write or erase a data bit. For example, the semiconductor diodes described in U.S. Published Application Numbers US 2007/0164309 A1 and US 2007/0072360 A1 which are hereby incorporated by reference in their entirety, can achieve three, four, or more stable resistivity states. In some embodiments of the present invention, semiconductor material can be converted from an initial low-resistivity state to a higher-resistivity state; then, upon application of an appropriate electrical pulse, can be returned to a lower-resistivity state. In other embodiments of the present invention, semiconductor material can be converted from an initial high-resistivity state to a lower-resistivity state; then, upon application of an appropriate electrical pulse, can be returned to a higher-resistivity state. The voltage pulses may be forward and/or reverse bias pulses to switch the diode from the higher to lower and/or from lower to higher resistivity states, respectively. These embodiments can be employed independently or combined to form a memory cell which can have two or more data states, and can be one-time-programmable or rewriteable.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of making a non-volatile memory device, comprising:
   forming a stack of alternating layers of a first material and a second material in a trench of an insulating material, wherein the first material comprises a semiconductor material and wherein the second material is insulating;

etching the stack to form at least one first rail-shaped opening in the stack, the at least one first rail-shaped opening extending in a first direction;

selectively etching the first material exposed in the at least one first rail-shaped opening to form first recesses in the first material such that the second material overhangs the first recesses;

doping a first outer portion of the first material exposed in the first recesses to form first conductivity type semiconductor portions of diodes;

forming a first conductive material in the first recesses and in the at least one first rail-shaped opening;

removing a portion of the first conductive material that is located in the at least one first rail-shaped opening to form separate horizontal bit lines in the first recesses;

forming a first insulating filling material in the at least one first rail-shaped opening;

etching the stack to separate the first material into a plurality of semiconductor features extending in a second direction different from the first direction;

forming a second insulating filling material between the plurality of semiconductor features;

etching the stack to form at least one second rail-shaped opening in the stack, the at least one second rail-shaped opening extending in the first direction;

doping a second outer portion of the first material exposed in the at least one second rail-shaped opening to form second conductivity type semiconductor portions of the diodes;

forming a storage material on a side wall of the at least one second rail-shaped opening in electrical contact of the second conductivity type semiconductor portions of the diodes such that at least a middle portion of the at least one second rail-shaped opening remains unfilled;

forming a second conductive material in the middle portion of the at least one second rail-shaped opening in electrical contact with the storage material; and etching the second conductive material to form separate word lines extending substantially vertically.

2. The method of claim 1, wherein:
the step of selectively etching the first material forms the first recesses in the first material in at least two device levels at the same time;
the step of doping the first outer portion of the first material dopes the first outer portion of the first material in at least two device levels at the same time;
the step of doping the second outer portion of the first material dopes the second outer portion of the first material in at least two device levels at the same time; and
the step of forming storage material forms storage elements in more than two device levels at the same time.

3. The method of claim 1, further comprising:
forming a first barrier layer on the side wall of the at least one second rail-shaped opening prior to forming the storage material; and
forming a second barrier layer on the storage material layer in the middle portion of the at least one second rail-shaped opening;
wherein the step of forming the second conductive material in the middle portion of the at least one second rail-shaped opening forms the second conductive material on the second barrier layer.

4. The method of claim 1, wherein the step of etching the stack to form the at least one first rail-shaped opening comprises:
forming a first mask pattern over the stack;
forming a first spacer layer over the first mask pattern; and
etching the stack using a combination of the first mask pattern and the first spacer layer as a mask.

5. The method of claim 4, wherein the step of etching the stack to form the at least one second rail-shaped opening comprises:
forming a second mask pattern over the stack;
forming a second spacer layer over the second mask pattern; and
etching the stack using a combination of the second mask pattern and the second spacer layer as a mask.

6. The method of claim 1, wherein the step of etching the stack to form the at least one second rail-shaped opening comprises:
forming rail-shaped mask features over the stack, the rail-shaped mask features extending in the second direction;
forming spacers between the rail-shaped mask features;
removing the rail-shaped mask features; and
etching the stack using the spacers as a mask.

7. The method of claim 1, wherein the step of selectively etching the first material exposed in the at least one first rail-shaped opening to form first recesses in the first material comprises:
n-type doping an outer portion of the first material comprising an intrinsic silicon layer exposed in the at least one first rail-shaped opening; and
selectively removing the n-typed doped outer portion of the first material exposed in the at least one first rail-shaped opening.

8. The method of claim 1, wherein the step of selectively etching the first material exposed in the at least one first rail-shaped opening to form first recesses in the first material comprises:
oxidizing or nitriding an outer portion of the first material comprising a silicon layer exposed in the at least one first rail-shaped opening; and
selectively removing the oxidized or nitrided outer portion of the first material exposed in the at least one first rail-shaped opening.

9. The method of claim 1, wherein the storage material comprises at least one of antifuse, fuse, metal oxide resistivity switching material, complex metal oxide resistivity switching material, carbon nanotube switching material, graphene resistivity switching material, carbon resistivity switching material, phase change resistivity switching material, conductive bridge element, or polymer resistivity switching material.

10. The method of claim 1, wherein:
the first material comprises an intrinsic semiconductor material that is not intentionally doped; and
the diodes comprise p-i-n diodes.

11. The method of claim 1, further comprising forming a plurality of first electrical contacts to the plurality of bit lines and a plurality of second electrical contacts to the plurality of word lines.

12. The method of claim 11, wherein at least one of the plurality of the first electrical contacts is electrically connected to at least two of the plurality of bit lines located adjacent to each other in a same device level.

* * * * *